(12) United States Patent
Lin

(10) Patent No.: US 11,101,272 B2
(45) Date of Patent: Aug. 24, 2021

(54) DRAM AND METHOD FOR MANUFACTURING THE SAME

(71) Applicant: WINBOND ELECTRONICS CORP., Taichung (TW)

(72) Inventor: Chih-Hao Lin, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/812,065

(22) Filed: Mar. 6, 2020

(65) Prior Publication Data

US 2020/0286894 A1   Sep. 10, 2020

(30) Foreign Application Priority Data

Mar. 8, 2019   (TW) .................................. 108107712

(51) Int. Cl.
H01L 27/108   (2006.01)

(52) U.S. Cl.
CPC .. *H01L 27/10823* (2013.01); *H01L 27/10814* (2013.01); *H01L 27/10855* (2013.01); *H01L 27/10876* (2013.01); *H01L 27/10888* (2013.01)

(58) Field of Classification Search
None
See application file for complete search history.

(56) References Cited

U.S. PATENT DOCUMENTS

| | | | |
|---|---|---|---|
| 7,659,567 B2 | 2/2010 | Aoki | |
| 8,431,981 B2 | 4/2013 | Kim et al. | |
| 9,842,841 B2 | 12/2017 | Kim et al. | |
| 2011/0220977 A1 | 9/2011 | Yoon et al. | |
| 2014/0061742 A1* | 3/2014 | Nishitani | H01L 27/10823 257/296 |
| 2016/0079246 A1* | 3/2016 | Kim | H01L 27/10873 257/401 |
| 2018/0174971 A1* | 6/2018 | Song | H01L 27/10823 |

FOREIGN PATENT DOCUMENTS

CN           102610612 A       7/2012

* cited by examiner

*Primary Examiner* — Steven M Christopher
(74) *Attorney, Agent, or Firm* — Muncy, Geissler, Olds & Lowe, P.C.

(57) ABSTRACT

A dynamic random access memory and its manufacturing method are provided. The memory includes a buried bit line, a plurality of buried word lines, a bit line contact structure, and a conductive plug. The buried bit line is formed in a substrate. A bottom surface of the buried word line is higher than a top surface of the buried bit line. The bit line contact structure is formed on the buried bit line and has a through hole. The bit line contact structure is not in direct contact with the buried bit line. A material of the bit line contact structure is different from a material of the buried bit line. The conductive plug is formed between the bit line contact structure and the buried bit line and fills the through hole, so that the bit line contact structure and the buried bit line are electrically connected.

11 Claims, 11 Drawing Sheets

DRAM AND METHOD FOR MANUFACTURING THE SAME

CROSS REFERENCE TO RELATED APPLICATIONS

This application claims priority of Taiwan Patent Application No. 108107712, filed on Mar. 8, 2019, the entirety of which is incorporated by reference herein.

BACKGROUND

Field of the Disclosure

The present disclosure relates to a memory device, and in particular it relates to a dynamic random access memory having a buried bit line and a method for manufacturing the dynamic random access memory.

Description of the Related Art

As dynamic random access memory (DRAM) is becoming smaller, the distance between the bit line and the adjacent capacitor contact structure is getting smaller and smaller, making it easy for a short circuit between them. Furthermore, if the parasitic capacitance between the bit line and the adjacent capacitor contact structure is too large, the value of the corresponding stored data will be difficult to distinguish. As a result, performance and yield of the product may be reduced.

In order to reduce parasitic capacitance, a conventional DRAM proposes to reduce the height (or thickness) of the bit line, and another conventional DRAM proposes to shorten the length of the bit line. However, the former will result in an increase in the electrical resistance value of the bit line, which is disadvantageous for the operation of the memory device and reduces the efficiency. In addition, the latter makes the number of bits corresponding to each bit line become smaller, resulting in a larger wafer area, which is not disadvantageous for the miniaturization of the memory device Therefore, there is still a demand in the art for miniaturized, high-performance and high-yield DRAMs and their formation methods.

BRIEF SUMMARY

The dynamic random access memory as provided in the disclosure includes a buried bit line, a plurality of buried word lines, a bit line contact structure, a conductive plug, and a capacitor structure. The buried bit line is formed in a substrate and extends along a first direction. The plurality of buried word lines are formed in the substrate. The buried word lines are parallel to each other and extend in a second direction that intersects the first direction. The bottom surfaces of the buried word lines are higher than the top surface of the buried bit line. The bit line contact structure is formed in the substrate and located on the buried bit line. The bit line contact structure surrounds a through hole. The through hole passes through the bit line contact structure. The bit line contact structure is not in direct contact with the buried bit line. The material of the bit line contact structure is different from the material of the buried bit line. The conductive plug is formed between the bit line contact structure and the buried bit line and fills the through hole. The buried bit line is electrically connected to the bit line contact structure by the conductive plug. The capacitor structure is formed on the substrate and between two adjacent buried word lines.

The disclosure also provides a method for manufacturing a dynamic random access memory. The method includes forming a buried bit line in a substrate. The buried bit line extends in a first direction. The method also includes forming a plurality of buried word lines in the substrate. The buried word lines are parallel to each other and extend in a second direction that intersects the first direction. The bottom surfaces of the buried word lines are higher than the top surface of the buried bit line. The method also includes forming a bit line contact structure on the buried bit line. The method also includes forming a through hole passing through the bit line contact structure. The bit line contact structure is not in direct contact with the buried bit line. The material of the bit line contact structure is different from the material of the buried bit line. The method also includes forming a conductive plug between the bit line contact structure and the buried bit line. The conductive plug fills the through hole. The buried bit line is electrically connected to the bit line contact structure by the conductive plug. The method also includes forming a capacitor structure on the substrate. The capacitor is between two adjacent buried word lines.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
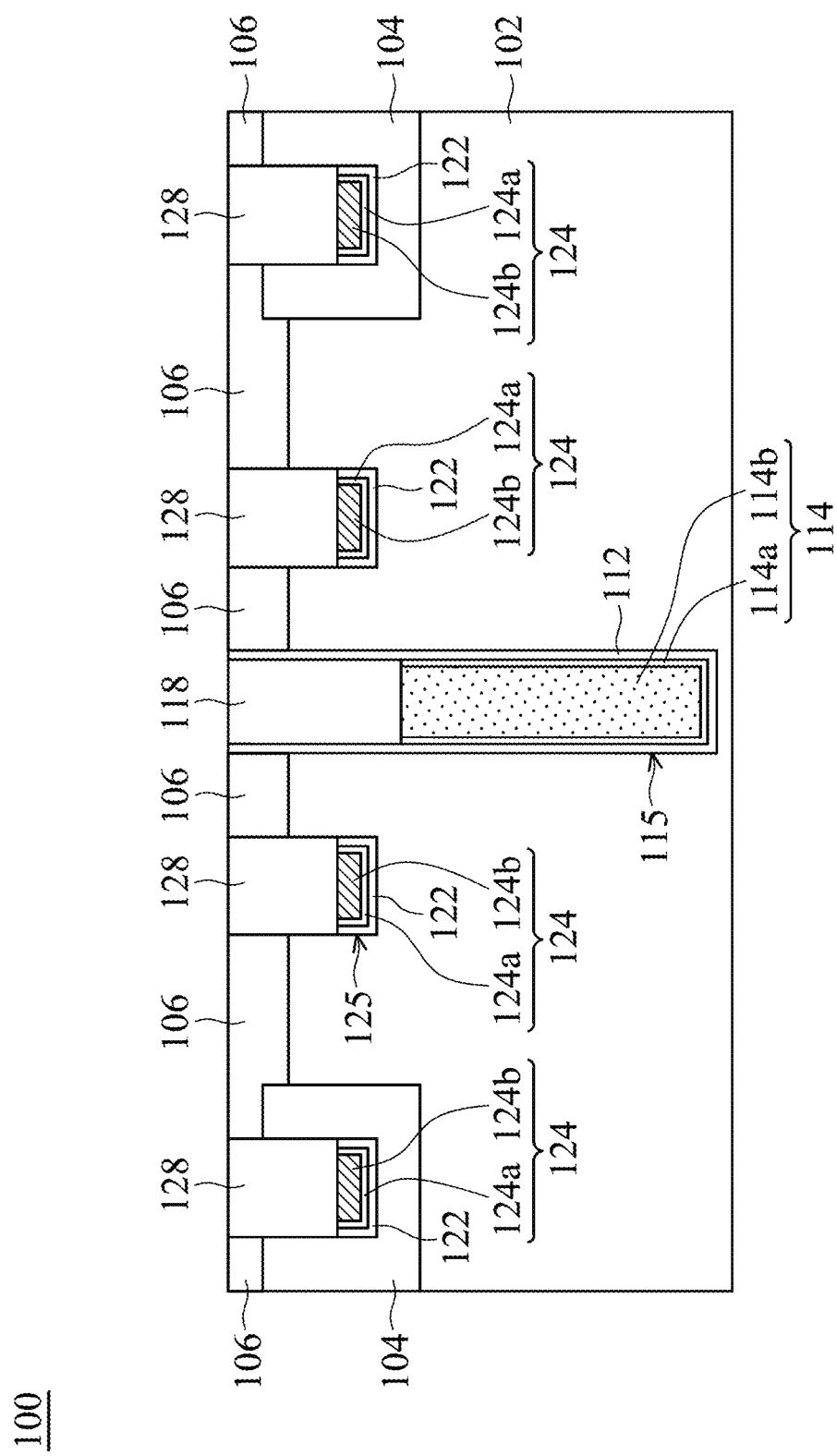
FIGS. 1A-1G show cross-sectional views of various stages of forming a DRAM in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, unless otherwise specified, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-1G show cross-sectional views of various stages of forming a dynamic random access memory (DRAM) 100 in accordance with some embodiments. Referring to FIG. 1A, a plurality of isolation structures 104 is formed in a substrate 102, and an insulating layer 106 is formed to cover the substrate 102 and the isolation structures 104. The material of the substrate 102 may include silicon, semiconductor containing silicon, silicon on insulator (SOI) substrate, or a combination thereof. In some embodiments, the substrate 102 is silicon substrate. In some embodiments, other structures may be formed in the substrate 102, for example, p/n-type well regions or conductive region (not shown) may be formed by implantation process. In the present embodiment, the isolation structures 104 are shallow trench isolations (STI).

Next, a buried bit line 114 is formed in the substrate 102. More specifically, a mask layer (not shown) is formed to cover the substrate 102 and the insulating layer 106. The mask layer, the substrate 102 and the insulating layer 106 are patterned to form a buried bit line trench 115. Next, a first insulating liner 112 and a first liner material are conformally and sequentially formed in the buried bit line trench 115. Afterwards, a first conductive material is filled into the buried bit line trench 115. Next, a portion of the first liner material and the first conductive material are removed by an etching back process to form a first liner 114*a* and a first conductive layer 114*b*. In the present specification, the first liner 114*a* and the first conductive layer 114*b* are named as "buried bit line 114". Afterwards, the insulating material is filled into the buried bit line trench 115 to form a first insulating layer 118.

Next, buried word lines 124 are formed in the substrate 102. More specifically, a mask layer (not shown) is formed to cover the substrate 102 and the insulating layer 106. The mask layer, the substrate 102 and the insulating layer 106 are patterned to form buried word line trenches 125. Next, a second insulating liner 122 and a second liner material are conformally and sequentially formed in the buried word line trenches 125. Afterwards, a second conductive material is filled into the buried word line trenches 125. Next, a portion of the second liner material and the second conductive material are removed by an etching back process to form a second liner 124*a* and a second conductive layer 124*b*. In the present specification, the second liner 124*a* and the second conductive layer 124*b* are named as "buried word line 124". Afterwards, the insulating material is filled into the buried word line trenches 125 to form a second insulating layer 128.

The material of the first insulating liner 112, the first insulating layer 118, the second insulating liner 122 and the second insulating layer 128 may be oxide, nitride, oxynitride, carbide, another suitable material, or a combination thereof. The material of the first insulating layer 118 is different from the material of the insulating layer 106 and the material of the first insulating liner 112. The material of second insulating liner 122 is different from the material of the second insulating layer 128. The first liner material and the second liner material may be titanium, titanium nitride, tungsten nitride, tantalum, tantalum nitride, another suitable conductive material, or a combination thereof. The first conductive material and the second conductive material may be tungsten, aluminum, copper, gold, silver, an alloy thereof, another suitable metal material, or a combination thereof. In the present embodiment, the material of the first insulating layer 118 and the second insulating liner 122 is silicon oxide; the material of the insulating layer 106, and the first insulating liner 112 and the second insulating layer 128 is silicon nitride; the material of the first liner and the second liner is titanium nitride; and the first conductive material and the second conductive material are tungsten.

Figure 1B:
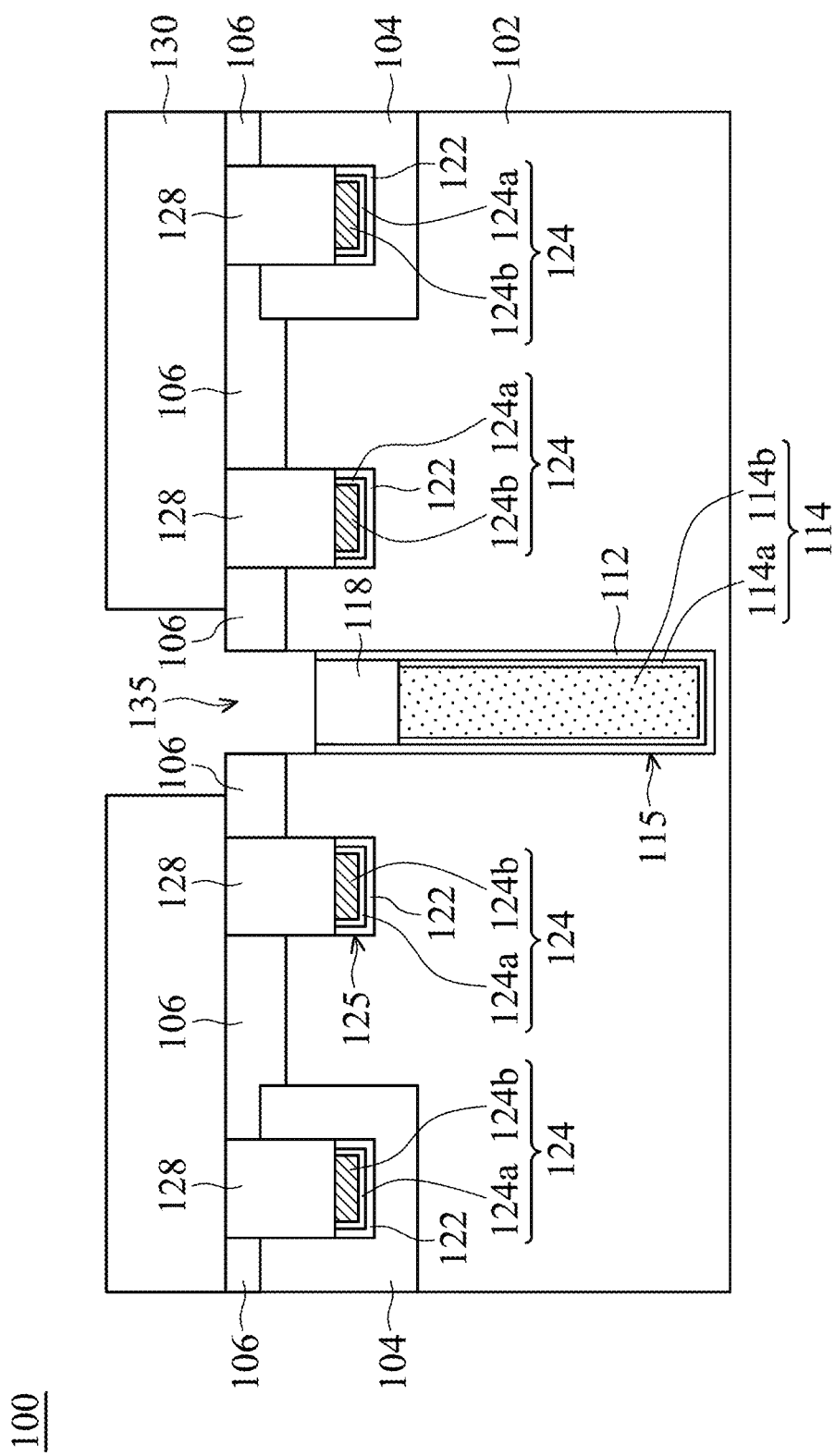

Referring to FIG. 1B, a mask layer 130 is formed to cover the substrate 102, the insulating layer 106, the first insulating layer 118, and the second insulating layer 128. An opening of the mask layer 130 exposes the first insulating layer 118 and insulating layer 106 around the first insulating layer 118. In order words, the opening of the mask layer 130 is greater than the opening of the buried bit line trench 115. The first insulating layer 118 is partially removed by an anisotropic etching process to form a first opening 135 in the first insulating layer 118. In the anisotropic etching process, the etching rate of the first insulating layer 118 is greater than the etching rate of the insulating layer 106. As a result, the first opening 135 is self-aligned formed in the buried bit line trench 115.

In addition, because the first insulating liner 112 is conformally formed in the buried bit line trench 115, the first insulating liner 112 is easily to be removed by the above-mentioned anisotropic etching process. In some embodiments, another etching process is optionally performed to ensure the removal of the first insulating liner 112. The thickness of the first insulating liner 112 is smaller than the thickness of the insulating layer 106. For example, the thickness of the insulating layer 106 is at least three times of the thickness of the first insulating liner 112.

Figure 1C:
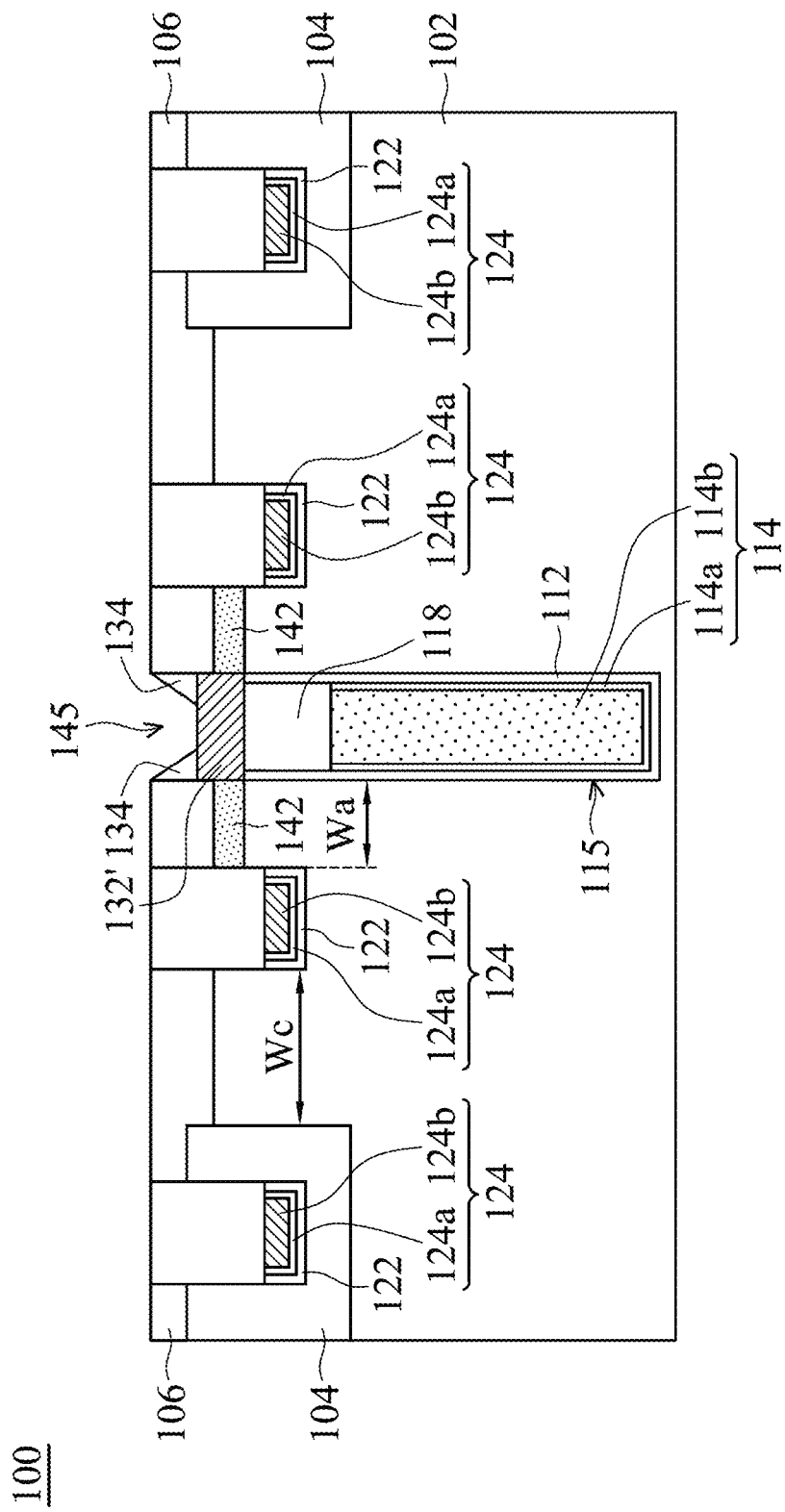

Referring to FIG. 1C, a conductive material layer 132' is filled into the first opening 135, and then an etching back process is performed on the conductive material layer 132', so that the top surface of the conductive material layer 132' is lower than the top surface of the insulating layer 106. The material of the conductive material layer 132' may be different from the material of the buried bit line 114. The material of the conductive material layer 132' may be doped polycrystalline silicon. In the present embodiment, the conductive material layer 132' is arsenic-doped polycrystalline silicon. In the present embodiment, the dopant in the conductive material layer 132' can diffuse into the substrate 102 to form the drain doped region 142 by the high temperature of the process. In other embodiments, the drain doped region 142 may be formed by an implantation process.

Next, an insulating spacer 134 is formed on the sidewalls of the first opening 135, and the insulating spacer 134 defines a second opening 145. The width of the top of the second opening 145 is larger than the width of the bottom of the second opening 145. The material of the insulating spacer 134 oxide, nitride, oxynitride, carbide, or a combination thereof. In the present embodiment, the insulating spacer 134 is the silicon nitride formed by chemical vapor deposition process.

Figure 1D:
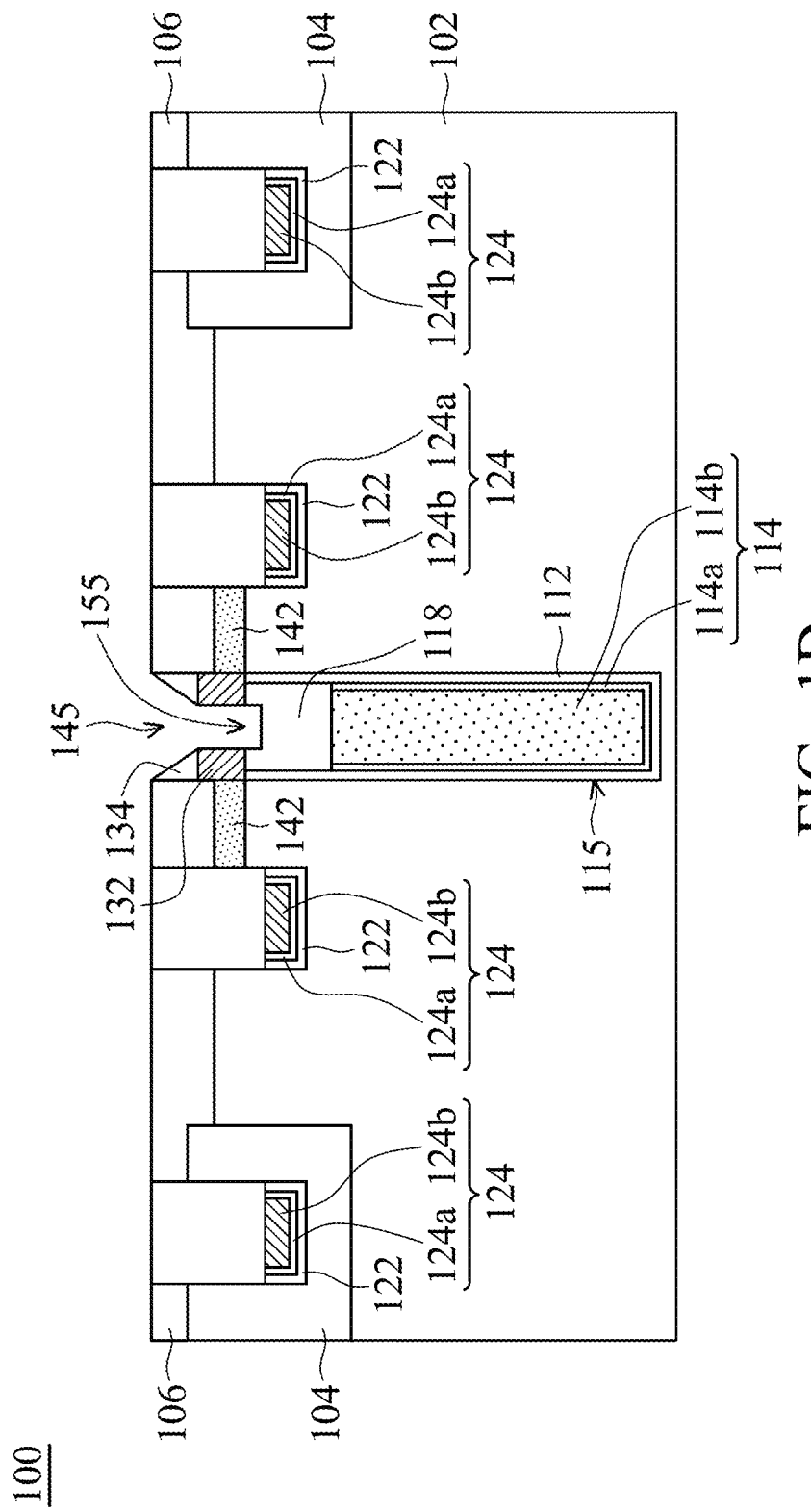

Referring to FIG. 1D, a first etching process is performed to form a through hole 155 passing through the conductive material layer 132' and extends into the first insulating layer 118. In the present embodiment, the first etching process is an anisotropic dry etching process. Furthermore, during the first etching process, the etching rate of the first insulating layer 118 or the etching rate of the conductive material layer 132' is much greater than the etching rate of the insulating spacer 134. Therefore, the insulating spacer 134 may be used as an etching mask to protect the underlying conductive material layer 132' from being removed. In other words, the through hole 155 is self-aligned with the second opening 145. Accordingly, the process is greatly simplified, and the time and cost of production is reduced. In the subsequent process, the buried bit line 114 can be electrically connected to the drain doped region 142 by the conductive material layer 132'. Therefore, in the specification, the conductive material layer 132' with the through hole 155 is also called a "bit line contact structure 132".

Figure 1E:
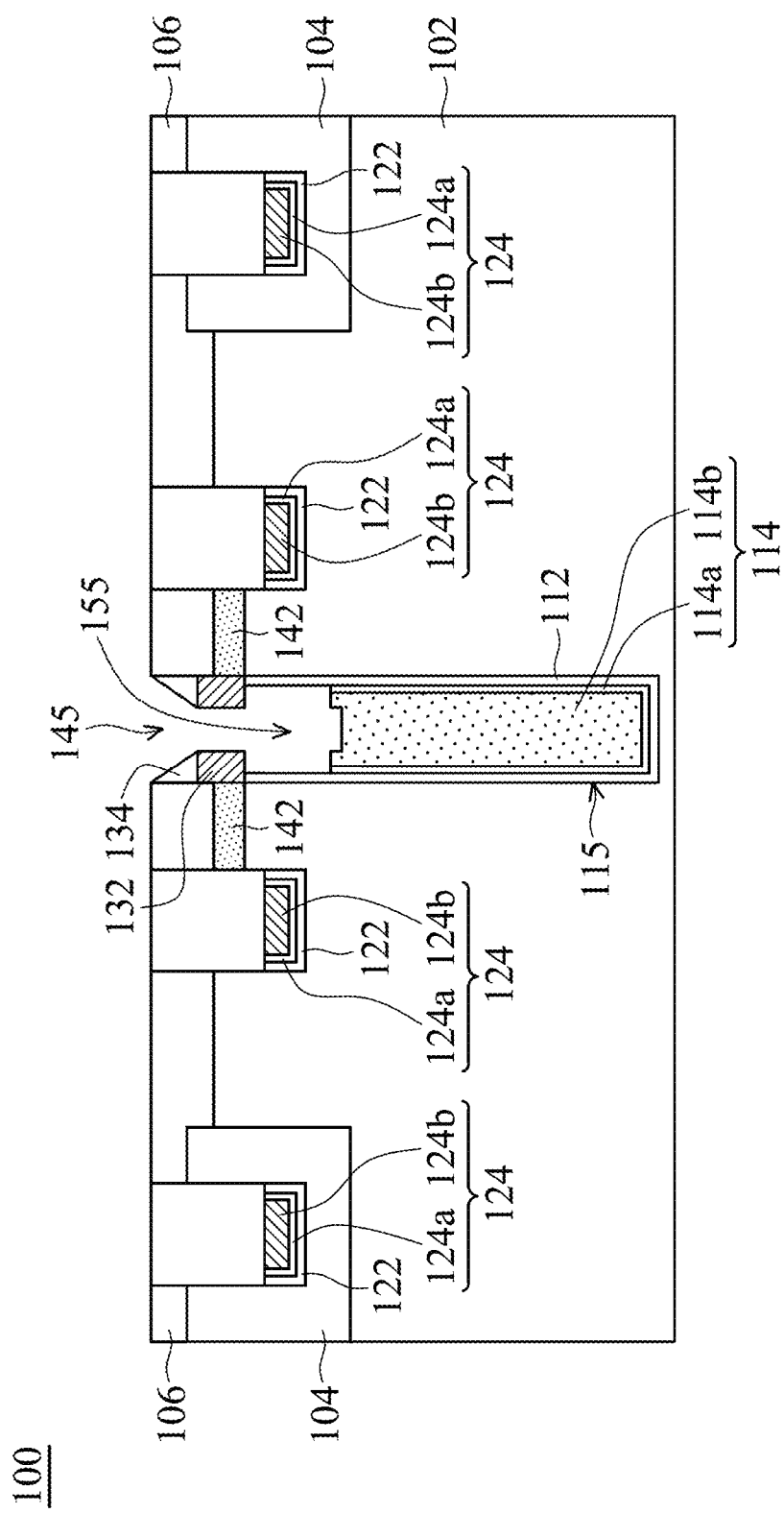

Referring to FIG. 1E, after the first etching process, a second etching process is performed to completely remove the first insulating layer 118 and to expose the buried bit line 114. The second etching process may include an isotropic etching process, an anisotropic etching process or a combination thereof. In the present embodiment, the second etching process is an isotropic wet etching process. Furthermore, during the second etching process, the etching rate of the first insulating layer 118 is much greater than the etching rate of the insulating spacer 134 or the etching rate of the conductive material layer 132'. Therefore, a portion of the through hole 155 located below the bit line contact structure 132 is expanded.

Figure 1F:
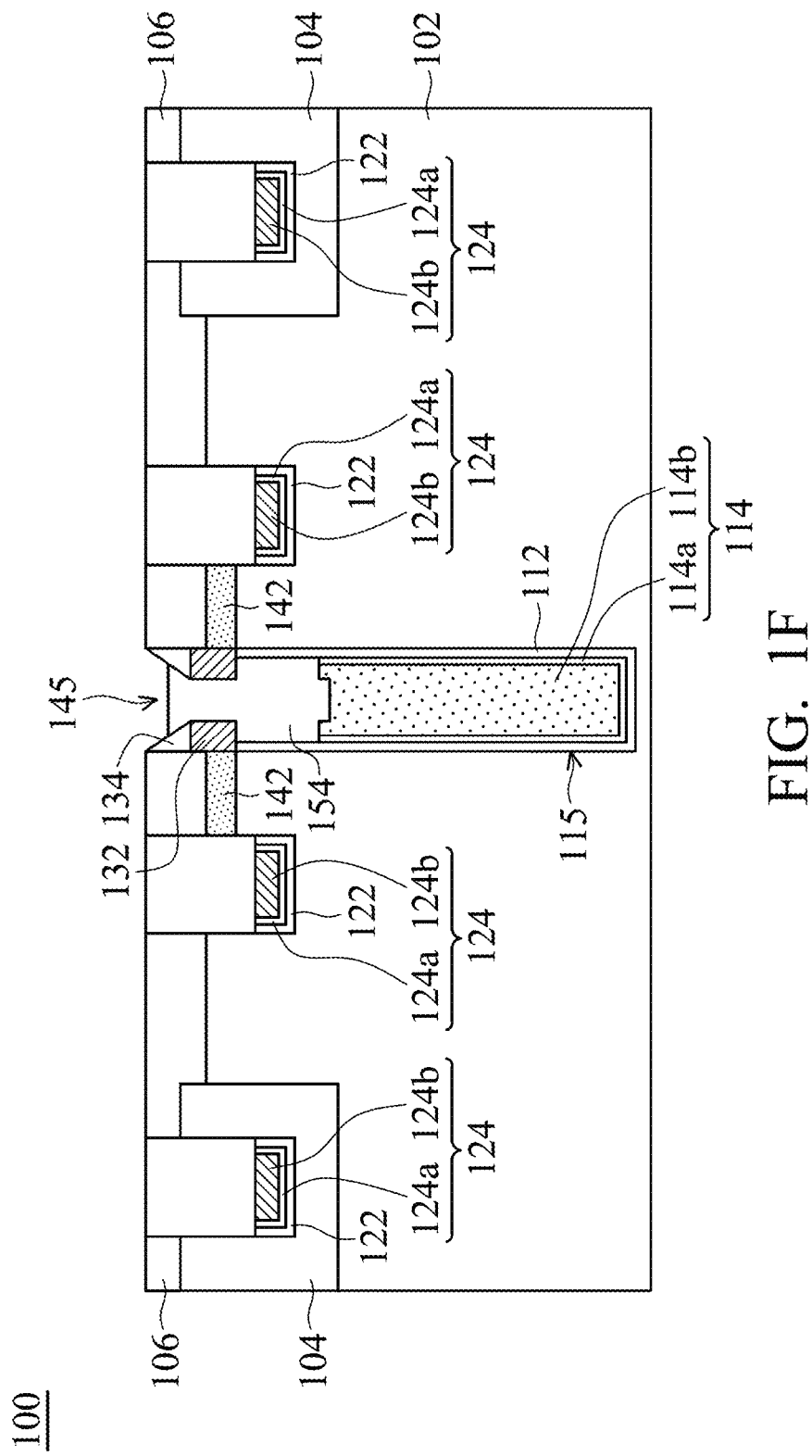

Referring to FIG. 1F, the second opening 145 and the through hole 155 are fully filled with conductive material. Next, a portion of the conductive material is etched back to form a conductive plug 154. The top surface of the conductive plug 154 is lower than the top surface of the insulating layer 106. The conductive plug 154 is in direct contact with the buried bit line 114. Therefore, the buried bit line 114 is electrically connected to the bit line contact structure 132 by the conductive plug 154. The conductive material with a better gap-filling ability may be selected as the material of the conductive plug 154 in order to reduce or eliminate voids in the conductive plug 154, thereby reducing the electrical resistance value of the conductive plug 154 or avoiding open circuit. As a result, the performance of the DRAM 100 is improved. The material of the conductive plug 154 may include titanium, titanium nitride, tungsten nitride, tantalum or tantalum nitride, another suitable conductive material, or a combination thereof. In the present embodiment, the material of the conductive plug 154 is titanium nitride. In addition, the top surface of the conductive plug 154 is higher than the top surface of the bit line contact structure 132 in order to ensure that the bit line contact structure 132 is not damaged when the conductive material is etched back. As a result, the breakage of the bit line contact structure 132 can be avoided, and the yield of the DRAM 100 is improved.

Figure 1G:
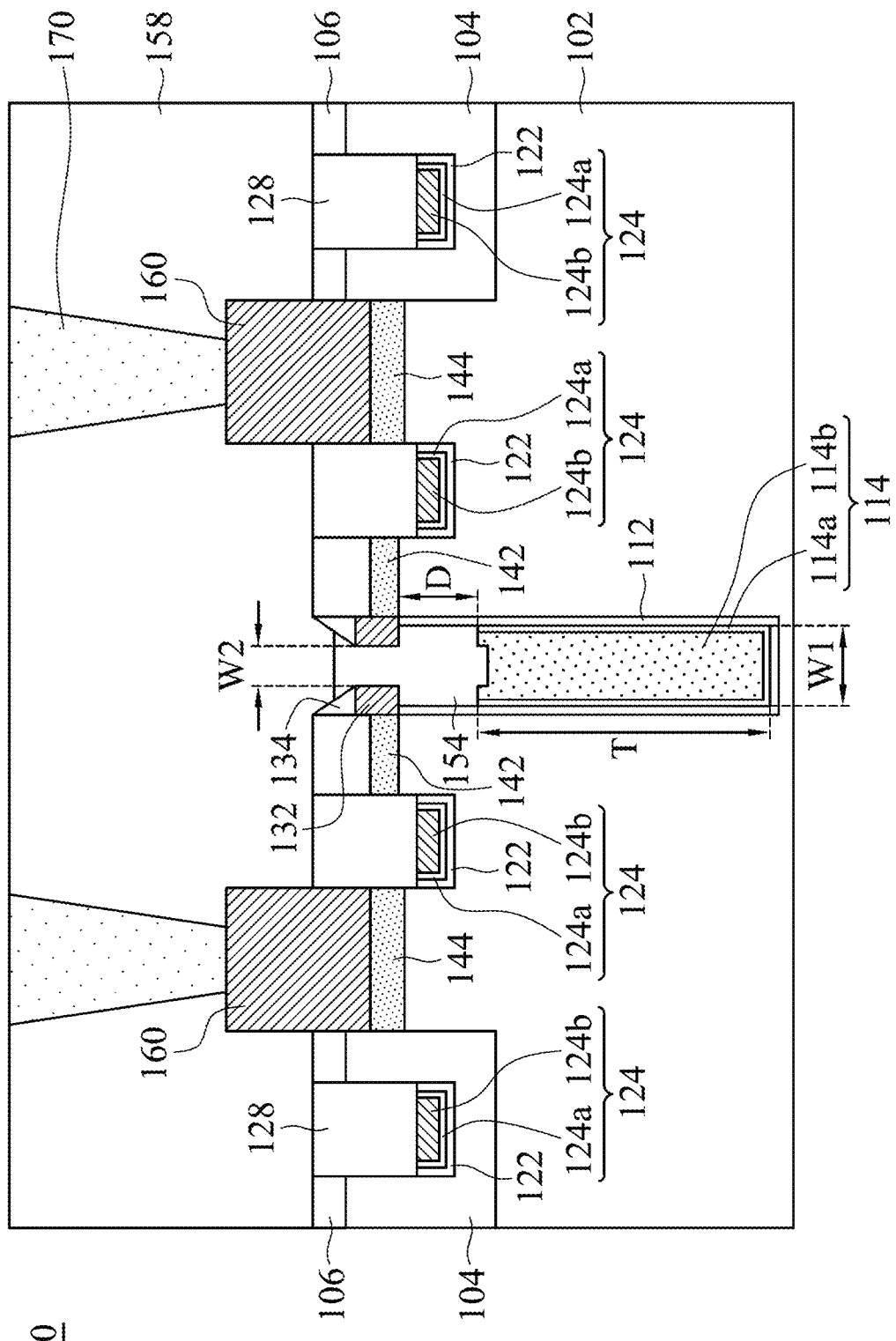

Referring to FIG. 1G, the insulating layer 106 between the buried word line 124 and the isolation structure 104 is removed, and then, the conductive material is deposited to form a capacitor contact structure 160 over the substrate 102. Next, an insulating layer 158 is formed to cover the substrate 102. The insulating layer 158 is patterned, and a plurality of capacitor structures 170 are formed in the insulating layer 158. The material of the insulating layer 158 may include oxide, nitride, or a combination thereof. The material of the capacitor contact structure 160 may include doped crystalline silicon, doped polycrystalline silicon, doped amorphous silicon, or a combination thereof. In the present embodiment, the material of the insulating layer 158 is silicon oxide, and the material of the capacitor contact structure 160 is arsenic-doped polycrystalline silicon. In the present embodiment, the dopant in the capacitor contact structure 160 can diffuse into the substrate 102 to form the source doped region 144 by the high temperature of the process. In other embodiments, the source doped region 144 may be formed by an implantation process. Next, other conventional processes may be performed to complete the formation the DRAM 100.

The method of manufacturing the DRAM provided in the present embodiment, the buried bit line 114 is formed first, and then, the buried word line 124 is formed. Therefore, the thickness of the buried bit line 114 can be optionally adjusted without affecting the buried word line 124. The electrical resistance value of the buried bit line 114 is lower as its thickness is larger, and therefore, the performance of the DRAM 100 is improved. In addition, because the buried bit line 114 and the capacitor contact structure 160 are respectively located above and below the substrate 102, even if the thickness of the buried bit line 114 is increased, the parasitic capacitance between the buried bit line 114 and the capacitor contact structure 160 is not increased. As a result, the performance and yield of the DRAM 100 can be significantly improved.

Figure 2:
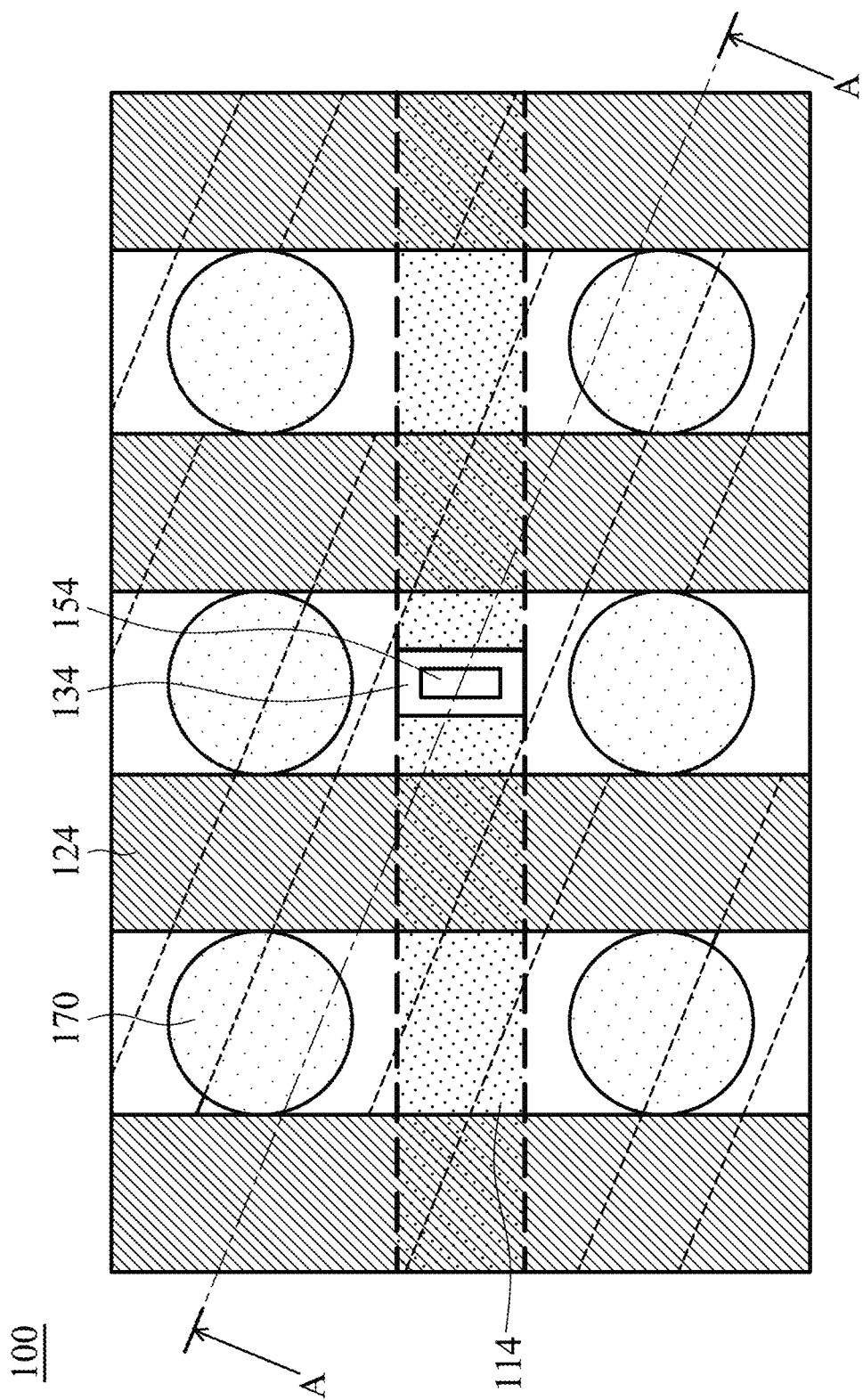
FIG. 2 shows a perspective top-view of the DRAM in accordance with some embodiments.

FIG. 2 shows a perspective top-view of the DRAM 100, in accordance with some embodiments. FIG. 1G is a cross-sectional view taken along line AA of FIG. 2. Referring to FIGS. 1G and 2, the DRAM 100 includes a plurality of buried word lines 124 and the buried bit line 114, and the bottom surface of the buried word line 124 is higher than the top surface of the buried bit line 114. The buried bit line 114 extends in the first direction. The buried word lines 124 are parallel to each other and extend in the second direction that intersects the first direction. In the present embodiment, the first direction is substantially perpendicular to the second direction. DRAM 100 includes the bit line contact structure 132 formed in the substrate 102, and the bit line contact structure 132 surrounds the through hole 155 passing through the bit line contact structure 132. The bit line contact structure 132 is formed above the buried bit line 114 and is not in direct contact with the buried bit line 114. The material of the bit line contact structure 132 is different from the material of the buried bit line 114. In some embodiments, the buried bit line 114 includes the first liner 114a and the first conductive layer 114b. The material of the bit line contact structure 132 is different from the material of the first liner 114a, and also different from the material of the first conductive layer 114b. DRAM 100 includes the conductive plug 154 formed between the bit line contact structure 132 and the buried bit line 114, and the conductive plug 154 is filled into the through hole 155. In some embodiments, the material of the conductive plug 154 is different from the material of the bit line contact structure 132, and the material of the conductive plug 154 is also different from the material of the first conductive layer 114b of the buried bit line 114. The buried bit line 114 is electrically connected to the bit line contact structure 132 by the conductive plug 154. DRAM 100 includes the capacitor structures 170 formed in the substrate 102 and between two adjacent buried word lines 124.

In some embodiments, the bit line contact structure 132 is spaced apart from the buried bit line 114 by a distance D, and the distance D is less than the thickness T of the buried bit line 114. Therefore, the electrical resistance value of the buried bit line 114 can be lowered. Furthermore, the buried bit line 114 is located at a depth D below the bit line contact structure 132, and the buried word line 124 is located between the buried bit line 114 and the bit line contact structure 132 to maintain a distance between the bit line 114 and the capacitive contact structure 160. As a result, even if the thickness T of the buried bit line 114 is increased, the parasitic capacitance between the buried bit line 114 and the capacitive contact structure 160 is still small.

In the present embodiment, the conductive plug 154 includes a first portion, a second portion and a third portion. The first portion of the conductive plug 154 extends upward from the top surface of the buried bit line 114 and has a first width W1. The second portion of the conductive plug 154 extends downward from the top surface of the bit line contact structure 132 and is adjacent to the first portion. The second portion of the conductive plug 154 has a second width W2 smaller than the first width W1. The third portion of the conductive plug 154 extends upward from the top surface of the bit line contact structure 132 and has a width that tapers downward. In the present embodiment, the electrical resistance value of the conductive plug 154 can be lowered by setting the first portion to be wider. Furthermore, as described above, by arranging the third portion of the conductive plug 154, it is possible to ensure that the bit line contact structure 132 is not damaged when the conductive material is etched back. In other embodiments, the conductive plug 154 only includes a first portion and a second portion. In other words, the top surface of the conductive plug 154 is co-planar with the top surface of the bit line contact structure 132.

Referring to FIG. 1C in the present embodiment, the DRAM 100 includes isolation structures 104, a buried bit line trench 115, and buried word line trenches 125 (shown in FIG. 1A) formed in the substrate 102. A portion of the buried word line trenches 125 (e.g., the second buried word line trench 125 at the left side in FIG. 1C) is between the isolation structure 104 and the buried bit line trench 115. The buried bit line 114 is formed in the buried bit line trench 115, and the buried word line 124 is formed in the buried word line trench 125. There isolation structure 104 is spaced apart from the adjacent buried word line trenches 125 by a first space Wc, and the buried bit line trench 115 is spaced apart from the buried word line trench 125 by a second space Wa. The first space Wc is greater than the second space Wa. Referring to FIG. 1G, the dopants in the drain doped region 142 come from the bit line contact structure 132, and the dopants in the source doped region 144 come from the capacitor contact structure 160. Because the volume of the bit line contact structure 132 is small, the dopant amount in the bit line contact structure 132 is also small. Therefore, if the second space Wa is smaller than the first space Wc, the electrical resistance value of the drain doping region 142 can be made close to the electrical resistance value of the source doping region 144, which is beneficial to the operation of the DRAM.

Figures 3A, 3B, 3C:
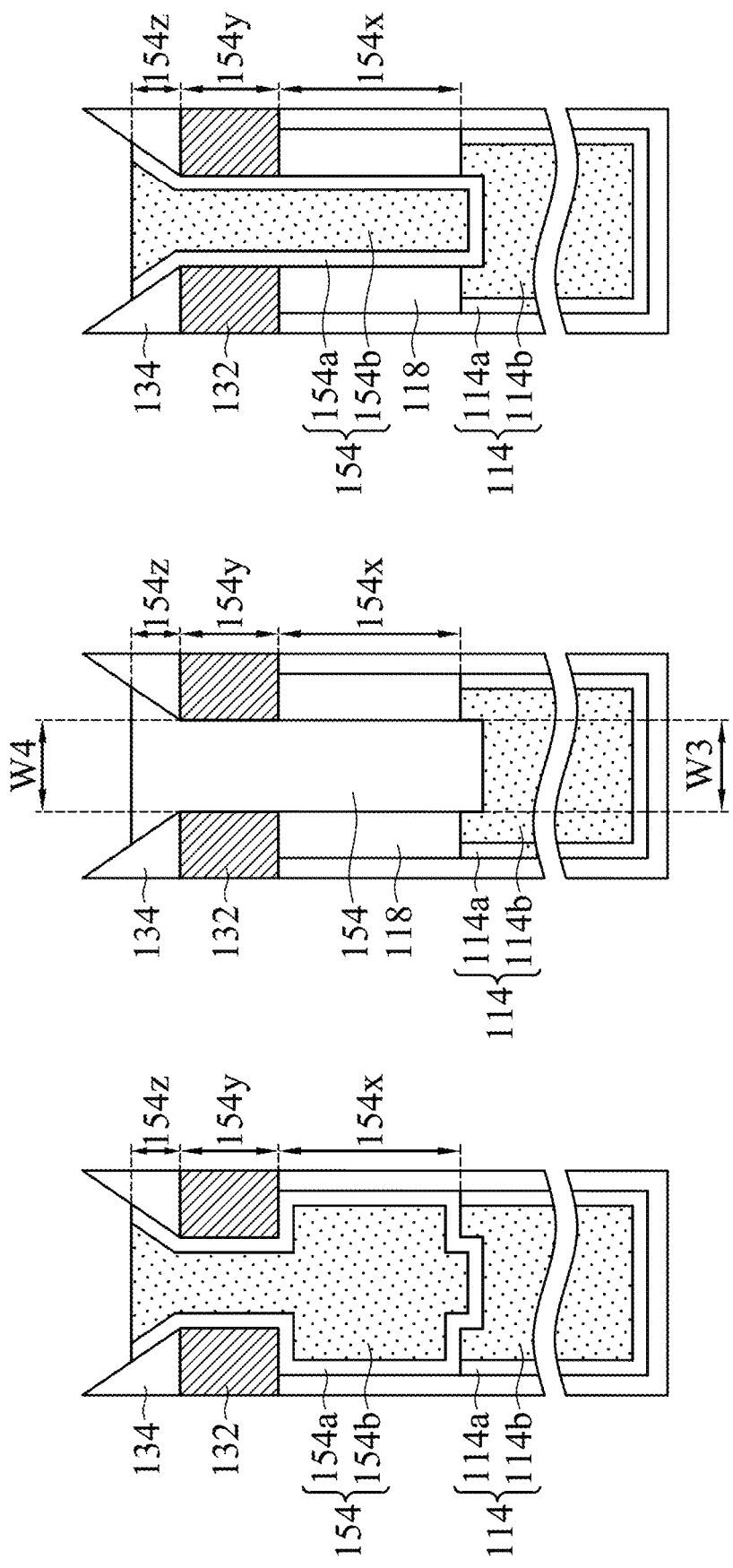
FIGS. 3A-3C show cross-sectional views of different conductive plugs in accordance with other embodiments.

FIGS. 3A-3C show cross-sectional views of different conductive plugs 154, in accordance with other embodiments. In order to simplify the drawing, FIGS. 3A-3C show only elements located in the buried bit line trench 115, and other elements which are the same as those of the DRAM 100 shown in FIG. 1G may be omitted. In FIGS. 3A-3C, elements that are the same as those in FIG. 1G are denoted by the same reference numerals. In order to simplify the description, the elements the same as those shown in FIG. 1G and the steps of forming the same are not described in detail herein.

The conductive plug 154 shown in FIG. 3A is similar to the conductive plug 154 shown in FIG. 1G, and the difference is that the conductive plug 154 of FIG. 3A includes a second liner 154a and a second conductive layer 154b. The second liner 154a is in direct contact with the buried bit line 114, and the second liner 154a is formed on surfaces of the through hole 155 of the bit line contact structure 132. After forming the structure shown in FIG. 1E, the second liner 154a is conformally formed on the surface of the through hole 155 and the second opening 145. Then, the through hole 155 and the second opening 145 are filled with the second conductive layer 154b. Then, a portion of the second liner 154a and the second conductive layer 154b are etched back to form the conductive plug 154 shown in FIG. 3A.

In the embodiment shown in FIG. 3A, the second liner 154a has good gap-filling ability, and the adhesion between the second liner 154a and the bit line contact structure 132 is good. Therefore, the second liner 154a can be conformally formed on the surface of the through hole 155, and the adhesion between the second conductive layer 154b and the bit line contact structure 132 can be improved. Furthermore, the conductivity of the second conductive layer 154b is good. Therefore, the electrical resistance value of the conductive plug 154 can be lowered. As a result, the performance of the DRAM 100 can be improved. The material of the second liner 154a may include titanium, titanium nitride, tungsten nitride, tantalum, tantalum nitride, or a combination thereof. The material of the second conductive layer 154b may include tungsten, aluminum, copper, gold, silver, an alloy thereof, or a combination thereof. In the present embodiment, the material of the second liner 154a is titanium nitride, and the material of the second conductive layer 154b is tungsten.

The difference between FIG. 3B and FIG. 1G is that, in FIG. 3B, there is a first insulating layer 118 surrounding the conductive plug 154 and between the bit line contact structure 132 and the buried bit line 114. After forming the structure shown in FIG. 1D, the first etching process may be continued until the top surface of the first conductive layer 114b is exposed. Then, without performing the second etching process, the conductive material with good gap-filling ability is filled in the through hole 155 and the second opening 145. Then, an etching back process is performed to form the conductive plug 154 shown in FIG. 3B.

In the present embodiment, the conductive plug 154 includes a first portion 154x, a second portion 154y, and a third portion 154z. The first portion 154x extends upward from the top surface of the buried bit line 114 and has a first width W3. The second portion 154y extends downward from the top surface of the bit line contact structure 132 and is adjacent to the first portion. The second portion of the conductive plug 154 has a second width W4 substantially equal to the first width W3. The third portion 154z extends upward from the top surface of the bit line contact structure 132 and has a width that tapers downward.

In the present embodiment, the lower portion of the through hole 155 is not widened, and therefore, the voids generated in the conductive plug 154 can be reduced or eliminated. As a result, the yield of the DRAM 100 is improved. Furthermore, in the present embodiment, the second etching process is not required, so that the process can be simplified. In addition, the etching solution of the second etching process can be prevented from remaining in the DRAM 100, and the risk of damage of other components can be reduced. In other embodiments, the second width W4 is less than the first width W3.

The conductive plug 154 shown in FIG. 3C is similar to the conductive plug 154 shown in FIG. 3B, and the difference is that the conductive plug 154 shown in FIG. 3C includes a second liner 154a and a second conductive layer 154b. In the present embodiment, the conductivity of the second conductive layer 154b is better than the conductivity of the second liner 154a. Therefore, the electrical resistance value of the conductive plug 154 can be lowered, and the performance of the DRAM 100 can be improved.

Figure 4C:
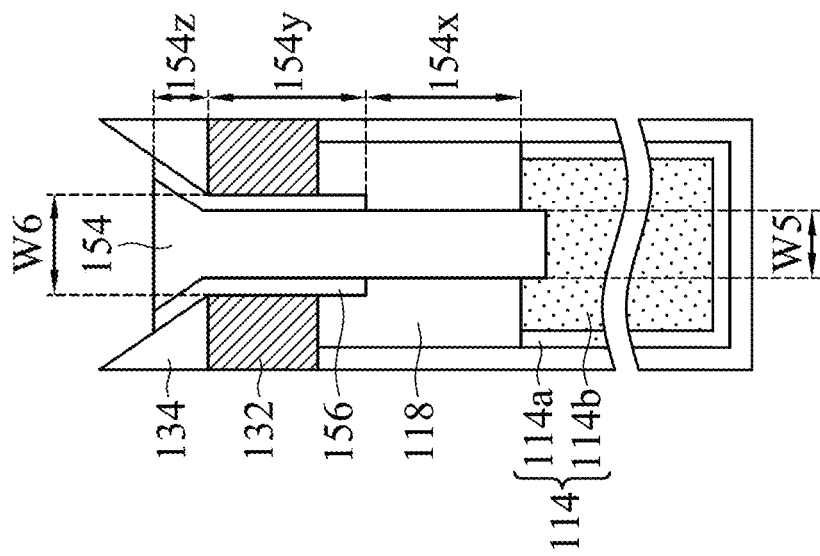
FIGS. 4A-4C show cross-sectional views showing various steps of manufacturing a different conductive plug in accordance with other embodiments.
Figure 4B:
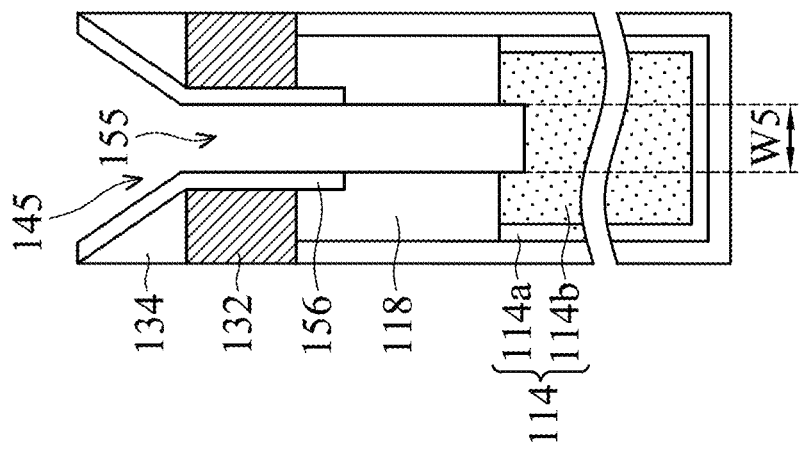
Figure 4A:
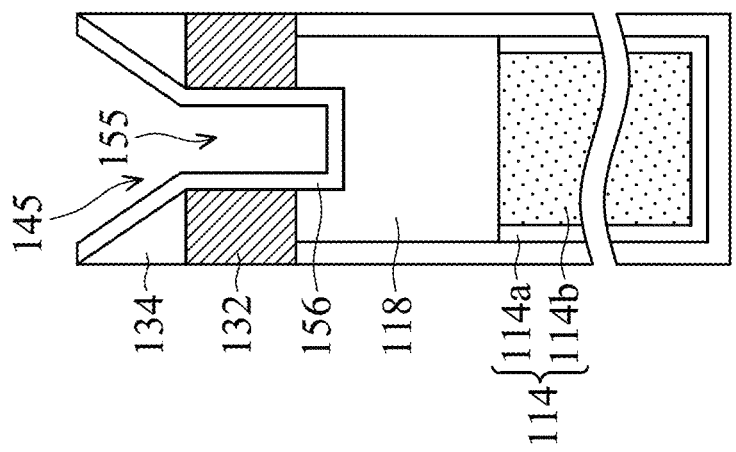

FIGS. 4A-4C show cross-sectional views showing various steps of manufacturing a different conductive plug in accordance with other embodiment. In order to simplify the drawing, FIGS. 4A-4C show only elements located in the buried bit line trench 115, and other elements which are the same as those of the DRAM 100 shown in FIG. 1G may be omitted. In FIGS. 4A-4C, elements that are the same as those in FIG. 1G are denoted by the same reference numerals. In order to simplify the description, the elements the same as those shown in FIG. 1G and the steps of forming the same are not described in detail herein.

Referring to FIG. 4A, after forming the structure shown in FIG. 1D, a conductive liner 156 is conformally formed on the surfaces of the through hole 155 and the second openings 145. Referring to FIG. 4B, a second etching process is performed to remove the conductive liner 156 at the bottom of the through hole 155 and a portion of the first insulating layer 118 to expose the buried bit line 114. Next, a conductive material with good gap-filling ability is filled in the through hole 155 and the second opening 145. Then, a portion of the conductive liner 156 and the conductive material are etched back to form the conductive plug 154 shown in FIG. 4C.

The material of the conductive liner 156 and the conductive plug 154 may be titanium, titanium nitride, tungsten nitride, tantalum, tantalum nitride, or a combination thereof. In the present embodiment, the conductive liner 156 and the conductive plug 154 are formed by titanium nitride, thereby simplifying the process. Furthermore, in the present embodiment, because the conductive liner 156 and the conductive plug 154 are formed by the same material, the conductive liner 156 is considered as a part of the conductive plug 154. In other embodiments, the conductive plug 154 includes the second liner 154a and the second conductive layer 154b. The second etch process may include an isotropic etching process, an anisotropic etching process, or a combination thereof. In the present embodiment, the second etching process is an anisotropic dry etching process.

Referring to FIG. 4C, in the present embodiment, the conductive plug 154 includes a first portion 154x, a second portion 154y, and a third portion 154z. The first portion 154x extends upward from the top surface of the buried bit line 114 and has a first width W5. The second portion 154y extends downwardly from the top surface of the bit line contact structure 132 and is adjacent to the first portion. The second portion of the conductive plug 154 has a second width W6 (i.e., the total width of the conductive liner 156 and the conductive plug 154), and the second width W6 is greater than the first width W5. The third portion 154z extends upward from the top surface of the bit line contact structure 132 and has a width that tapers downward.

In the present embodiment, during the second etching process, the conductive liner 156 covers the sidewalls of the bit line contact structure 132, thereby ensuring that the bit line contact structure 132 is not damaged by the second etching process (for example, lateral etching). Furthermore, in the present embodiment, the second etching process is a dry etching process, and therefore, the etching solution can be prevented from remaining in the DRAM 100. In addition, in the present embodiment, the lower portion of the through hole 155 is not widened, and therefore, the voids generated in the conductive plug 154 can be reduced or eliminated. With the above improvements, the yield of DRAM 100 can be further improved.

Figure 5C:
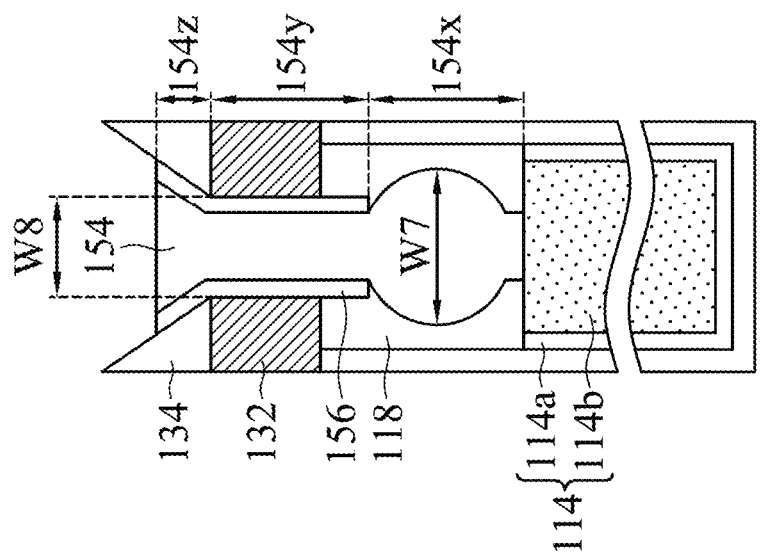
FIGS. 5A-5C show cross-sectional views showing various steps of manufacturing a different conductive plug in accordance with other embodiments.
Figure 5B:
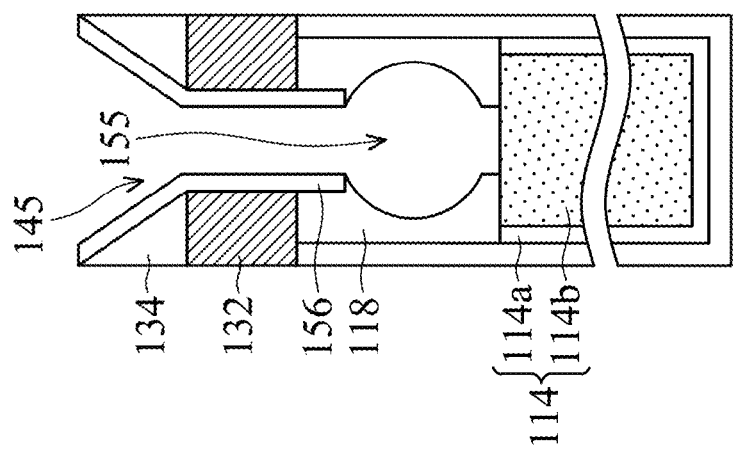
Figure 5A:
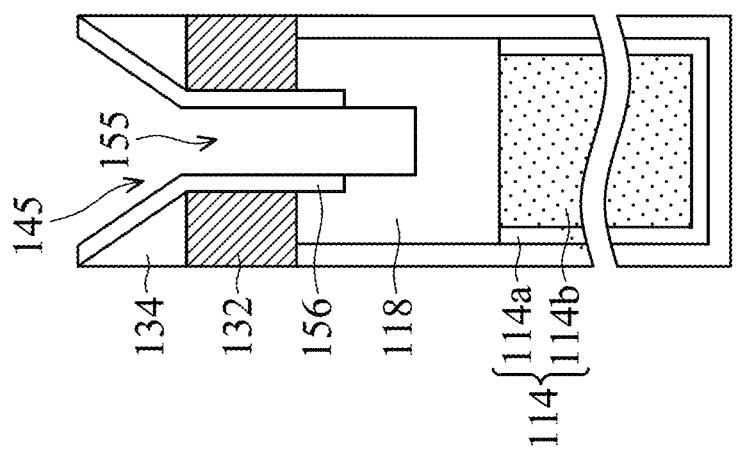

FIGS. 5A-5C show cross-sectional views showing various steps of manufacturing a different conductive plug in accordance with other embodiments. In order to simplify the drawing, FIGS. 5A-5C show only elements located in the buried bit line trench 115, and other elements which are the same as those of the DRAM 100 shown in FIG. 1G may be omitted. In FIGS. 5A-5C, elements that are the same as those in FIG. 1G are denoted by the same reference numerals. In order to simplify the description, the elements the same as those shown in FIG. 1G and the steps of forming the same are not described in detail herein.

Referring to FIG. 5A, after forming the structure shown in FIG. 1D, the conductive liner 156 is conformally formed on the surfaces of the through hole 155 and the second openings 145. Referring to FIG. 5B, a second etching process is performed to remove the conductive liner 156 at the bottom of the through hole 155 and a portion of the first insulating layer 118 to expose the buried bit line 114. Next, a conductive material with good gap-filling ability is filled in the through hole 155 and the second opening 145. Then, a portion of the conductive liner 156 and the conductive material are etched back to form the conductive plug 154 shown in FIG. 5C.

In the present embodiment, both the conductive liner 156 and the conductive plug 154 are formed by titanium nitride. Therefore, the conductive liner 156 is considered to be a part of the conductive plug 154. In other embodiments, the conductive plug 154 includes a second liner 154a and a second conductive layer 154b. The second etching process can include an isotropic etching process, an anisotropic etching process, or a combination thereof. In the present embodiment, the second etching process is an isotropic wet etching process.

Referring to FIG. 5C, the first insulating layer 118 is not completely removed, and the first insulating layer 118 between the bit line contact structure 132 and the buried bit line 114 surrounds the conductive plug 154. In the present embodiment, the conductive plug 154 includes a first portion 154x, a second portion 154y, and a third portion 154z. The first portion 154x extends upward from the top surface of the buried bit line 114, and the sidewalls of the first portion 154x protrude toward the first insulating layer 118. The maximum width of the first portion 154x is defined as the first width W7. The second portion 154y extends downwardly from the top surface of the bit line contact structure 132 and is adjacent to the first portion. The second portion of the conductive plug 154 has a second width W8 (i.e., the total width of the conductive liner 156 and the conductive plug 154), and the second width W8 is smaller than the first width W7. The third portion 154z extends upward from the top surface of the bit line contact structure 132 and has a width that tapers downward. In the present embodiment, the lower portion of the through hole 155 is widened, thereby reducing the resistance of the conductive plug 154. As a result, the performance of the DRAM 100 is improved.

As described above, in the method of manufacturing the DRAM provided by the embodiments of the present invention, the thickness of the buried bit line can be increased as needed to reduce the electrical resistance value. Therefore, the performance of DRAM is improved. Furthermore, because the buried bit line and the capacitor contact structure are respectively located above and below the substrate, the parasitic capacitance between the buried bit line and the capacitor contact structure can be reduced. Therefore, the performance and yield of the DRAM can be greatly improved. In addition, the through hole can be formed in a self-aligned manner on the bit line contact structure, thereby greatly simplifying the process and reducing the time and cost required for production.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A dynamic random access memory, comprising:
   a buried bit line formed in a substrate, wherein the buried bit line extends in a first direction;
   a plurality of buried word lines formed in the substrate, wherein the buried word lines are parallel to each other and extend in a second direction that intersects the first direction, and bottom surfaces of the buried word lines are higher than a top surface of the buried bit line;
   a bit line contact structure formed in the substrate, wherein the bit line contact structure is located on the buried bit line and surrounds a through hole, the through hole passes through the bit line contact structure, the bit line contact structure is not in direct contact with the buried bit line, and a material of the bit line contact structure is different from a material of the buried bit line;
   a conductive plug formed between the bit line contact structure and the buried bit line and filling the through hole, wherein the buried bit line is electrically connected to the bit line contact structure by the conductive plug; and
   a capacitor structure formed on the substrate and between two adjacent buried word lines.

2. The dynamic random access memory as claimed in claim 1, wherein the bit line contact structure is spaced apart from the buried bit line by a distance, and the distance is less than the thickness of the buried bit line.

3. The dynamic random access memory as claimed in claim 1, wherein the buried but line comprises a first liner and a first conductive layer, the first conductive layer comprises a first conductive material, and the bit line contact structure comprises a second conductive material different from the first conductive material.

4. The dynamic random access memory as claimed in claim 3, wherein the conductive plug is formed by a third conductive material, and the third conductive material is different from the first conductive material and the second conductive material.

5. The dynamic random access memory as claimed in claim 1, further comprising:
   an insulating layer formed between the bit line contact structure and the buried bit line and surrounding the conductive plug.

6. The dynamic random access memory as claimed in claim 5, wherein the conductive plug comprises:
   a first portion extending upward from the top surface of the buried bit line, wherein the first portion has a first width; and
   a second portion extending downward from a top surface of the bit line contact structure and adjacent to the first portion, wherein the second portion has a second width greater than the first width.

7. The dynamic random access memory as claimed in claim 1, wherein the conductive plug comprises:
   a first portion extending upward from the top surface of the buried bit line, wherein the first portion has a first width; and
   a second portion extending downward from a top surface of the bit line contact structure and being adjacent to the first portion, wherein the second portion has a second width that is equal to or smaller than the first width.

8. The dynamic random access memory as claimed in claim 7, further comprising:
   an insulating layer formed between the bit line contact structure and the buried bit line and surrounding the conductive plug, wherein a sidewall of the first portion of the conductive plug protrudes toward the first insulating layer.

9. The dynamic random access memory as claimed in claim 3, wherein the conductive plug comprises a second liner and a second conductive layer, wherein the second liner is in direct contact with the buried bit line, and the second liner is formed on a surface of the through hole of the bit line contact structure.

10. The dynamic random access memory as claimed in claim 1, wherein a top surface of the conductive plug is higher than a top surface of the bit line contact structure.

11. The dynamic random access memory as claimed in claim 1, further comprising:
    an isolation structure formed in the substrate;
    a plurality of buried word line trenches formed in the substrate, wherein the buried word lines are formed in the buried word line trenches;
    a buried bit line trench formed in the substrate, wherein the buried bit line is formed in the buried bit line trench;
    wherein a portion of each of the plurality of buried word line trenches is between the isolation structure and the buried bit line trench, the isolation structure is spaced apart from the portion of the buried word line trench by a first space, the buried bit line trench is spaced apart from the portion of the buried word line trench by a second space, and the first space is greater than the second space.

* * * * *